United States Patent [19]
Yoshida

[11] Patent Number: 5,670,901
[45] Date of Patent: Sep. 23, 1997

[54] EFFECTIVE SIGNAL DETECTION CIRCUIT DEVICE OF SERIAL TRANSMISSION APPARATUS USING BI-PHASE CODE

[75] Inventor: Yutaka Yoshida, Kawasaki, Japan

[73] Assignee: Fuji Electric Co., Ltd., Japan

[21] Appl. No.: 527,556

[22] Filed: Sep. 13, 1995

[30] Foreign Application Priority Data

Sep. 13, 1994 [JP] Japan .................................. 6-218447

[51] Int. Cl.$^6$ .................................................. H03K 5/19
[52] U.S. Cl. .............................. 327/148; 377/80; 377/81
[58] Field of Search ............................ 327/18, 19, 22,
327/23, 72, 277, 284, 291; 326/104, 105;
377/57, 64, 67, 76, 80, 81

[56] References Cited

U.S. PATENT DOCUMENTS

| | | | |
|---|---|---|---|
| 3,721,906 | 3/1973 | Geesen et al. | 327/18 |
| 4,279,017 | 7/1981 | Bos et al. | 327/18 |
| 4,308,472 | 12/1981 | McLaughlin | 327/18 |
| 4,472,686 | 9/1984 | Nishimura et al. | 329/50 |
| 4,789,996 | 12/1988 | Butcher | 375/120 |
| 5,208,833 | 5/1993 | Erhart et al. | 375/20 |
| 5,258,721 | 11/1993 | Zanders | 327/18 |
| 5,459,419 | 10/1995 | Hatakenaka | 327/18 |
| 5,512,846 | 4/1996 | Hori | 377/76 |
| 5,526,390 | 6/1996 | Fucili | 377/54 |

OTHER PUBLICATIONS

"ISP Slave Hardware Design, Server Prototype Hardware Example" Copyright ISP Foundation, 1992, 1993, InterOperable Systems (tm).

Primary Examiner—Timothy P. Callahan
Assistant Examiner—My-Trang Nu Ton
Attorney, Agent, or Firm—Rossi & Associates

[57] ABSTRACT

An effective signal detection circuit for serial transmission apparatuses using bi-phase code is provided, which effective signal detection circuit facilitates reducing variation of characteristics, current consumption, and dimensions thereof. The effective signal detection circuit comprises a shift register further comprising three D-FFs connected in a series input and parallel output circuit; and a determining circuit further comprising an AND element, an NOR element, and a NOR element. A clock pulse having a frequency twice as high as the bit frequency of a bi-phase coded input signal RX is fed to the clock terminals of the D-FFs. The shift register obtains, based on the clock pulse, a parallel signal bundle $Q_1$, $Q_2$, $Q_3$ corresponding to three consecutive half bits of the input signal RX. The parallel signals $Q_1$, $Q_2$, $Q_3$ are input to the input terminals of the AND element and the NOR element connected in parallel. The output terminals of the AND element and the NOR element are connected to the input terminals of the NOR element. The NOR element 33 outputs a DV signal indicating existence or non-existence of an effective input signal RX.

4 Claims, 7 Drawing Sheets

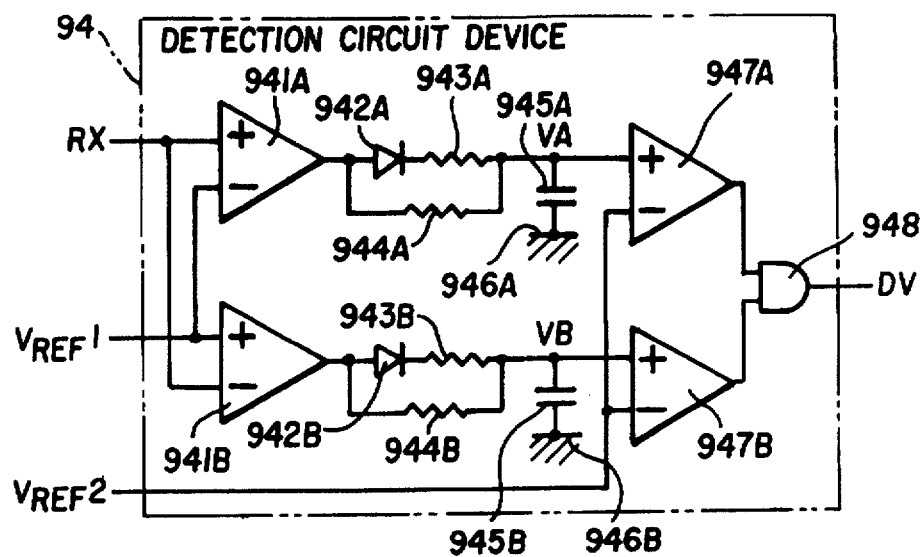
FIG. 12
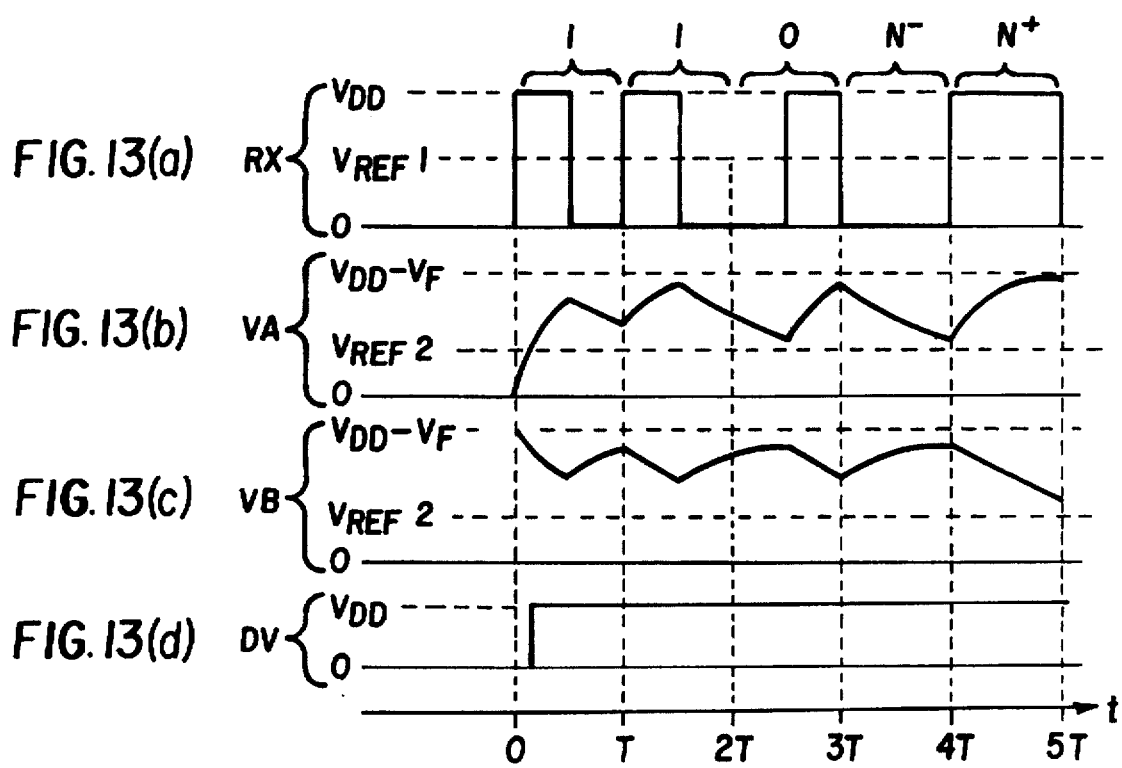
FIG. 13(a)
FIG. 13(b)
FIG. 13(c)
FIG. 13(d)

EFFECTIVE SIGNAL DETECTION CIRCUIT DEVICE OF SERIAL TRANSMISSION APPARATUS USING BI-PHASE CODE

FIELD OF THE INVENTION

The present invention relates to an effective signal detection circuit device, provided to a receiver circuit device, for determining whether an effective signal to be received by the receiver circuit device exists or does not exist on a transmission channel of a serial transmission system that transmits data by using bi-phase codes. More specifically, the invention relates to a structure of the effective signal detection circuit device that facilitates preventing malfunction and reducing its dimensions.

BACKGROUND

As is well known, data transmission systems which transmit data by using binary signals include a parallel transmission system and a serial transmission system. At the start of data transmission in these transmission systems, the transmission systems determine without exception whether an effective signal exists on a transmission channel or does not exist. While a transmitter is detecting the effective signal, the transmitter determines that another transmitter is transmitting data and waits until the effective signal is not detected any more. Further, a receiver conducts a receiving operation only while the effective signal exists on the transmission channel. In the other periods, the receiver is usually switched to a waiting mode to save electric power consumption.

In the parallel transmission systems such as GPIB (a kind of data transmission system that transmits data by using binary signals according to the IEEE-488 Standard), SCSI (a kind of data transmission system that transmits data by using binary signals according to the ANSI standard), etc. one transmission channel is used which has a plurality of transmission lines. The transmission lines include, in addition to the data lines, a signal line that transmits a binary signal indicative of execution of data transmission (indicated by a high signal level or a low signal level), and a signal line that transmits a binary signal indicative of preparatory and completed states of data transmission and receiving. Since a plurality of transmission stations are usually connected to a transmission channel, a station should be appointed that acquires an exclusive right for using the channel. This is generally referred to as "arbitration".

Serial data transmission systems, which have only one transmission line or a pair of transmission lines, cannot execute the arbitration in the same way as the parallel transmission systems. The serial data transmission systems which use bi-phase coding, e.g. field buses, employ a following method. At first, the bi-phase coding will be explained with reference to FIG. 9 which shows a general example of bi-phase coding. In the bi-phase coding, codes indicating "1" and "0" of the binary signal are distinguished by arrangements of a signal level of positive potential (hereinafter referred to as "+ signal" or simply as "+") and a signal level of negative potential (hereinafter referred to as "− signal" or simply as "−") arranged in the front half and the rear half of a period T of one bit that is an inverse number of a bit frequency of the bi-phase codes (see (a) and (b) of FIG. 9). (Each of the front and the rear halves of the period T is referred to as "a half bit".)

Therefore, in the bi-phase coding, the code indicating "1" or "0" always includes a "+ signal" and a "− signal". Owing to this, a same signal level never continues longer than a bit period T in a bi-phase code train (an alignment of bi-phase codes on a time scale) as shown in FIG. 10. In some cases, special codes "N+" and "n−" are used in addition to the codes indicating "1" and "0" (see (c) and (d) of FIG. 9). Even when the special codes "N+" and "n−" are used, continuation of a certain signal level longer than the bit period T is avoided by following code arrangement rules described below in items 1 through 6. In addition, an arithmetic mean of the signal levels within a certain period of time may be smoothed out to be zero by using the same number of the special codes "N+" and "n−" within the certain period of time.

(1) The special code "N+" shall not be continued.
(2) The special code "N−" shall not be continued.
(3) The code "0" shall not be put immediately before the special code "N+".
(4) The code "1" shall not be put immediately behind the special code "N+".
(5) The code "1" shall not be put immediately before the special code "N−".
(6) The code "0" shall not be put immediately behind the special code "N−".

The serial transmission systems which use the bi-phase codes determine whether an effective signal is existing on the transmission channel or not by using the nature of the bi-phase codes described above in such a circuit shown in FIG. 12. FIG. 12 is a circuit diagram showing a main portion of a conventional effective signal detection circuit device that determines existence or non-existence of an effective signal. In FIG. 12, the conventional effective signal detection circuit device 94 has a pair of circuits, each of which is includes comparators 941 and 947, a diode 942, resistors 943 (the resistance thereof is R1) and 944 (the resistance thereof is R2), and a capacitor (the static capacitance thereof is C). An alphabet A or B is attached to the tail of a reference numeral of a constituent for indicating either one of the circuits to which the constituent belongs. The effective signal detection circuit device 94 also has an AND circuit 948 that has two input terminals to which are connected the comparators 947A and 947B. A reference numeral 946 designates a ground terminal.

The effective signal detection circuit device 94 is interposed between a transmission channel on which signals are transmitted with the bi-phase codes and an electronic device that sends and receives the signals as shown in FIG. 11. The detection circuit device 94 is used in an interface device that interfaces the transmission channel and the electronic device with the signals. FIG. 11 is a block diagram showing the interface device that uses the effective signal detection circuit device shown in FIG. 12 together with the transmission channel and the electronic device.

In FIG. 11, a transmitted signal 81 coded by the bi-phase coding is transmitted on a transmission channel 8A of a serial transmission system. Art electronic device 8B sends and receives a signal 82 in an appropriate form. An interface device 9 is interposed between the transmission channel 8A and the electronic device 8B and interfaces the transmitted signal 81 with the signal 82. The interface 9 includes a modem 91 having an input terminal that receives the transmitted signal 81 from the transmission channel 8A as an input signal RX and an output terminal that outputs an output signal TX to the transmission channel 8A; a receiver circuit device 92 connected between the transmission channel 8A and the modem 91; and a driver circuit device 95 connected between the transmission channel 8A and the modem 91. The receiver circuit device 92 is consisted of a receiver circuit 93 and the detection circuit device 94.

The modem 91 receives the effective transmitted signal 81 from the receiver circuit 93 when a DV signal indicative of existence of the effective transmitted signal 81 on the transmission channel 8A is output from the detection circuit device 94, demodulates the transmitted signal 81 to the signal 82, and outputs the signal 82 to the electronic device 8B through the driver circuit device 95. The modem 91 modulates the signal 82 output from the electronic device 8B to the signal 81 and outputs the signal 81 to the transmission channel 8A when a DV signal indicative of non-existence of the effective transmitted signal 81 on the transmission channel 8A is output from the detection circuit device 94.

The operation of the effective signal detection circuit device 94 will now be explained with reference to a timing chart shown in FIG. 13. For the sake of simplifying the explanation, it is assumed that the circuit elements of the detection circuit device 94 satisfy following conditions. The comparators 941 and 947 show ideal characteristics including the output amplitude of from 0 to $V_{DD}$ for the in-phase input amplitude of from 0 to $V_{DD}$, infinite input impedance, and zero output impedance. The diode 942 shows ideal characteristics including forward voltage drop of constant $V_F$, irrespective of the forward current values, a zero internal resistance value and a zero reverse current value. In FIG. 12, the corresponding circuit elements designated by the same reference numeral but distinguished by A and B are assumed to have the same characteristic values.

The effective signal detection circuit device 94 receives the input signal RX, which is the transmitted signal 81 according to the bi-phase coding (the amplitude thereof is from 0 to $V_{DD}$), at the non-inverting input terminal of the comparator 941A and at the inverting input terminal of the comparator 941B. When the input signal RX (the signal 81) is effective, the detection circuit device 94 sets the DV signal output from the AND circuit 948 at a high level ($\approx V_{DD}$). When the transmitted signal 81 is not existing, that is when the input signal RX is not effective, the input signal RX is fixed at 0 or $V_{DD}$. In this case, the detection circuit device 94 set the DV signal at a low level ($\approx 0$).

FIG. 13 shows that the level of the DV signal is 0 in an initial operation stage of the detection circuit device 94 during which any signal to be transmitted is not existing. Since a reference potential $V_{REF1}$ (a potential taking an arbitrary value between 0 and $V_{DD}$ for detecting the level of the input signal RX) is input to the inverting terminal of the comparator 941A in the initial operation stage, the comparator 941A outputs a signal at a low level (hereinafter referred to as "L"). The comparator 941B, to the non-inverting terminal thereof is input the reference potential $V_{REF1}$, outputs a signal at a high level (hereinafter referred to as "H"). Therefore, the voltage vA of the capacitor 945A charged up with the output of the comparator 941A is "L", and the voltage vB of the capacitor 945B charged up with the output of the comparator 941B is "H". The "H" value for the voltage v is set to be $V_{DD}-V_F$ considering the voltage drop $V_F$ across the diode 942.

When the bi-phase code "1" is input as the input signal RX at a time t=0 (cf (a) of FIG. 13), the output of the comparator 941A is switched to "H", and the output of the comparator 941B to "L" during a period between t=0 and t=T/2. Due to this, the capacitor 945A is charged up with a time constant $\tau_{CA}$ ($=C_A \times (R_{1A} \cdot R_{2A}/(R_{1A}+R_{2A}))$) (cf (b) of FIG. 13). The capacitor 945B is discharged from "H" to "L" with a time constant $\tau_{DB}$ ($=C_B \times R_{2B}$) (cf (b) of FIG. 13). The output of the comparator 941A is switched to "L", and the output of the comparator 941B to "H" during a period between t=T/2 and T. Due to this, the capacitor 945A is discharged from the vA value at the time t=T/2 to "L" with a time constant $\tau_{DA}$ ($=C_A \times R_{2A}$), and the capacitor 45B is charged up from the $v_B$ value at the time t=T/2 to "L" to "H" with a time constant $\tau_{CB}$ ($=C_B \times (R_{1B} \cdot R_{2B}/(R_{1B}+R_{2B}))$). The charge-up time constants $\tau_{CA}$ and $\tau_{CB}$ are shorter than the discharge time constants $\tau_{CA}$ and $\tau_{DB}$ owing to the provision of the diode 941. Since the charge-up time and the discharge time of the capacitors 945 are identical to one another when the effective transmitted signal represented by the bi-phase codes exists, the values $v_A$ and $v_B$ take positive values.

The output voltage of the comparator 947A is set to be "H" by $v_A$ input to the non-inverting terminal of the comparator 947A and by a reference potential $V_{REF2}$ input to the inverting terminal of the comparator 947A. The reference potential $V_{REF2}$ is a potential for detecting the level of the voltage v of the capacitors 945, and is set to be lower than the values of $v_A$ and $v_B$ when the effective transmitted signal 81 is existing. The output voltage of the comparator 947B is also set to be "H" by vB input to the non-inverting terminal of the comparator 947B and a reference potential $V_{REF2}$ input to the inverting terminal of the comparator 947B. Since the output voltages of the respective comparators 947A and 947B are input to the respective input terminals of the AND circuit 948, the DV signal, i.e. an output of the AND circuit 948, shows "H" indicating existence of the effective transmitted signal 81.

While the transmitted signal 81 does not exist during which the output signal RX is fixed to be 0 or $V_{DD}$, the capacitors 945 connected to the output "1" of the comparators 941 continues to be discharged. As a result, since the output of the comparator 947A or 947B is set to be "L" at a time at which the $v_A$ or $v_B$ has lowered below the reference voltage $V_{REF2}$, the output of the AND circuit 948 shows "L" indicating non-existence of the effective transmitted signal 81.

The conventional interface device 9, that employs the effective signal detection circuit device 94 described above, is manufactured usually by using discrete devices for the circuit elements constituting the receiver circuit device 92 and the driver circuit device 95, and by using gate arrays for the circuit elements constituting the modem 91. The effective signal detection circuit device 94, that constitutes a part of the receiver circuit device 92, is also manufactured by using discrete devices.

Problems have not been caused in the conventional effective signal detection circuit device 94 of the serial transmission system using the bi-phase codes even though the detection circuit device 94 was constructed by using discrete devices. However, it has been recently required that the dimensions and cost of the interface circuit device 9 be reduced. To meet these needs, there remains no way but to integrate the receiver circuit device and the driver circuit device into an IC. Further more, it has become unavoidable to integrate the receiver circuit device, the driver circuit device and the modem 91 on a single chip.

However, when the circuit devices having the circuit configurations shown in FIG. 12 is integrated into an IC, the resistance value of the resistors and the static capacitance value of the capacitors deviate more than those of the discrete devices. Further, the temperature coefficient of the resistance of the resistors shows a wider deviation than that of the discrete device. Since these wider deviations further cause deviations of the discharge time constants $\tau_D$ and charge-up constants $\tau_D$, it is very difficult to manufacture with high yield the effective signal detection circuits which execute the predetermined operation.

It is necessary to set the discharge time constants $\tau_D$ to be longer than the bit period T for facilitating determining operation of the detection circuit device 94. Due to this, when the bit period is 32 μ sec, the static capacitance C of the capacitors 945 should be 6400 pF or more when the resistance $R_2$ of the resistors 944 is 50 kΩ. The power consumption of the detection circuit device 94 is determined mainly from the operation currents of the four comparators 941, 947 and charge-up currents of the capacitors 945. The power consumption of the detection circuit device 94 including the circuit elements having these circuit constants amounts to large several hundreds μA even when low power-consumption type comparators are adopted to the comparators 941 and 947.

It is also necessary to incorporate relatively large resistors and capacitors in an IC for obtaining a discharge time constant τD of several tens μ sec. Since a wide area of about 100,000 μm² is necessary for laying out these relatively large elements on an IC wafer, down-sizing of the detection circuit 94 subjects to a limitation.

SUMMARY OF THE INVENTION

In view of the foregoing, it is an object of the present invention to provide an effective signal detection circuit device of serial transmission systems which transmit data by using bi-phase codes, which effective signal detection circuit device facilitates reducing variation of operation characteristics, current consumption, and dimensions thereof.

According to an aspect of the present invention, there is provided an effective signal detection circuit device included in a receiver circuit device of a serial transmission apparatus that transmits data using bi-phase codes consisted of two half bits the effective signal detection circuit device comprising: a shift register for converting every half bit of the bi-phase codes to a parallel signal by using a clock signal having a frequency obtained by multiplying a bit frequency of the bi-phase codes by an even number; and a determining circuit, thereto parallel signals corresponding to at least three consecutive half bits are input from the shift register, for determining existence or non-existence of an effective transmitted signal.

According to another aspect of the present invention, the determining circuit further comprises a detector circuit for detecting the parallel signals corresponding to at least three consecutive half bits, the parallel signals having a same signal level whereby to determine non-existence of an effective transmitted signal.

According to still another aspect of the present invention, the determining circuit further comprises a detector circuit for detecting one of the parallel signals corresponding to at least three consecutive half bits, the one of the parallel signals having a signal level different from the signal level of the other parallel signals, whereby to determine existence of an effective transmitted signal.

According to still another aspect of the present invention, the determining circuit further comprises a first determining part for detecting one of the parallel signals corresponding to at least three consecutive half bits, the one of the parallel signals having a signal level different from the signal level of the other parallel signals, and for outputting an output signal indicating existence of an effective transmitted signal; a second determining part for detecting the parallel signals corresponding to at least three consecutive half bits, the parallel signals having a same signal level, and for outputting an output signal indicating non-existence of an effective transmitted signal; and a flip flop circuit having a reset terminal and a set terminal, the flip flop circuit being set by the output signal of the first determining part input to the set terminal thereof, the flip flop circuit being reset by the output signal of the second determining part input to the reset terminal thereof, and the flip flop circuit outputs an output signal as an output signal of the determining circuit.

The shift register preferably comprises logic circuit elements, and the determining circuit preferably comprises logic circuit elements.

Parallel signals are obtained, at first, from a shift register of the effective signal detection circuit device of a serial transmission apparatus that transmits data using bi-phase codes by providing the effective signal detection circuit device with the shift register for converting every half bit of the bi-phase codes to a parallel signal by using a clock signal having a frequency obtained by multiplying a bit frequency of the bi-phase codes by an even number; and a detector circuit, thereto parallel signals corresponding to at least three consecutive half bits are input from the shift register, for detecting the parallel signals corresponding to at least three consecutive half bits having a same signal level, whereby to determine non-existence of an effective transmitted signal, or for detecting one of the parallel signals corresponding to at least three consecutive half bits having a signal level different from the signal level of the other parallel signals, whereby to determine existence of an effective transmitted signal.

The thus obtained parallel signals are input to the detector circuit. When the detector circuit is the one that determines non-existence of an effective transmitted signal when the parallel signals corresponding to at least three consecutive half bits have a same signal level, the detector circuit detects non-existence of an effective bi-phase codes based on the nature of the bi-phase codes that a same signal level does not continue longer that the bit period T. When the detector circuit is the one that determines existence of an effective transmitted signal when one of the parallel signals corresponding to at least three consecutive half bits has a signal level different from the signal level of the other parallel signals, the detector circuit detects existence of an effective bi-phase codes based on the nature of the bi-phase codes that a same signal level does not continue longer that the bit period T. Therefore, existence or non-existence of effective bi-phase codes can be detected without using a circuit having a long circuit time constant.

Parallel signals are obtained, at first, from a shift register of the effective signal detection circuit device of a serial transmission apparatus that transmits data using bi-phase codes by providing the effective signal detection circuit device with the shift register for converting every half bit of the bi-phase codes to a parallel signal by using a clock signal having a frequency obtained by multiplying a bit frequency of the bi-phase codes by an even number; and a determining circuit, thereto parallel signals corresponding to at least three consecutive half bits are input from the shift register, for determining existence or non-existence of an effective transmitted signal, the determining circuit further comprising: a first determining part for detecting one of the parallel signals corresponding to at least three consecutive half bits having a signal level different from the signal level of the other parallel signals and for outputting an output signal indicating existence of an effective transmitted signal; a second determining part for detecting the parallel signals corresponding to at least three consecutive half bits having a same signal level and for outputting an output signal indicating non-existence of an effective transmitted signal; and a flip flop circuit having a reset terminal and a set terminal, the flip flop circuit being set by the output signal of the first determining part input to the set terminal thereof, the flip flop circuit being reset by the output signal of the second determining part input to the reset terminal thereof, and the flip flop circuit outputs an output signal as an output signal of the determining circuit.

The thus obtained parallel signals are input to the first determining part and the second determining part of the determining circuit.

The first determining part detects existence of an effective bi-phase codes based on the nature of the bi-phase codes that a same signal level does not continue longer that the bit period T and outputs an output signal indicating existence of an effective bi-phase codes. This output signal sets the flip flop circuit, and the flip flop circuit outputs an output signal indicating existence of an effective bi-phase codes. The flip flop circuit keeps its set state according to its specific nature until a signal indicating non-existence of an effective bi-phase codes will be output from the second determining part.

The second determining part detects non-existence of an effective bi-phase codes based on the nature of the bi-phase codes that a same signal level does not continue longer that the bit period T and outputs an output signal indicating non-existence of an effective bi-phase codes. This output signal resets the flip flop circuit, and the flip flop circuit stops outputting an output signal indicating existence of an effective bi-phase codes. The flip flop circuit keeps its reset state according to its specific nature until a signal indicating existence of an effective bi-phase codes will be output from the first determining part.

By constituting shift register with logic circuit elements, and the determining circuit with logic circuit elements, the effective signal detection circuit device of a serial transmission apparatus can be constructed only by standard circuit elements. Further, existence or non-existence of effective bi-phase codes can be detected without using a circuit having a long circuit time constant.

BRIEF DESCRIPTION OF THE DRAWINGS

FIG. 7 is a timing chart for explaining the operation of the effective signal detection circuit device of FIG. 4;

FIG. 12 is a circuit diagram showing a main portion of the conventional effective signal detection circuit device; and FIG. 13 is a timing chart for explaining the operation of the conventional effective signal detection circuit device of FIG. 12.

DETAILED DESCRIPTION OF THE PREFERRED EMBODIMENTS

Figure 1:
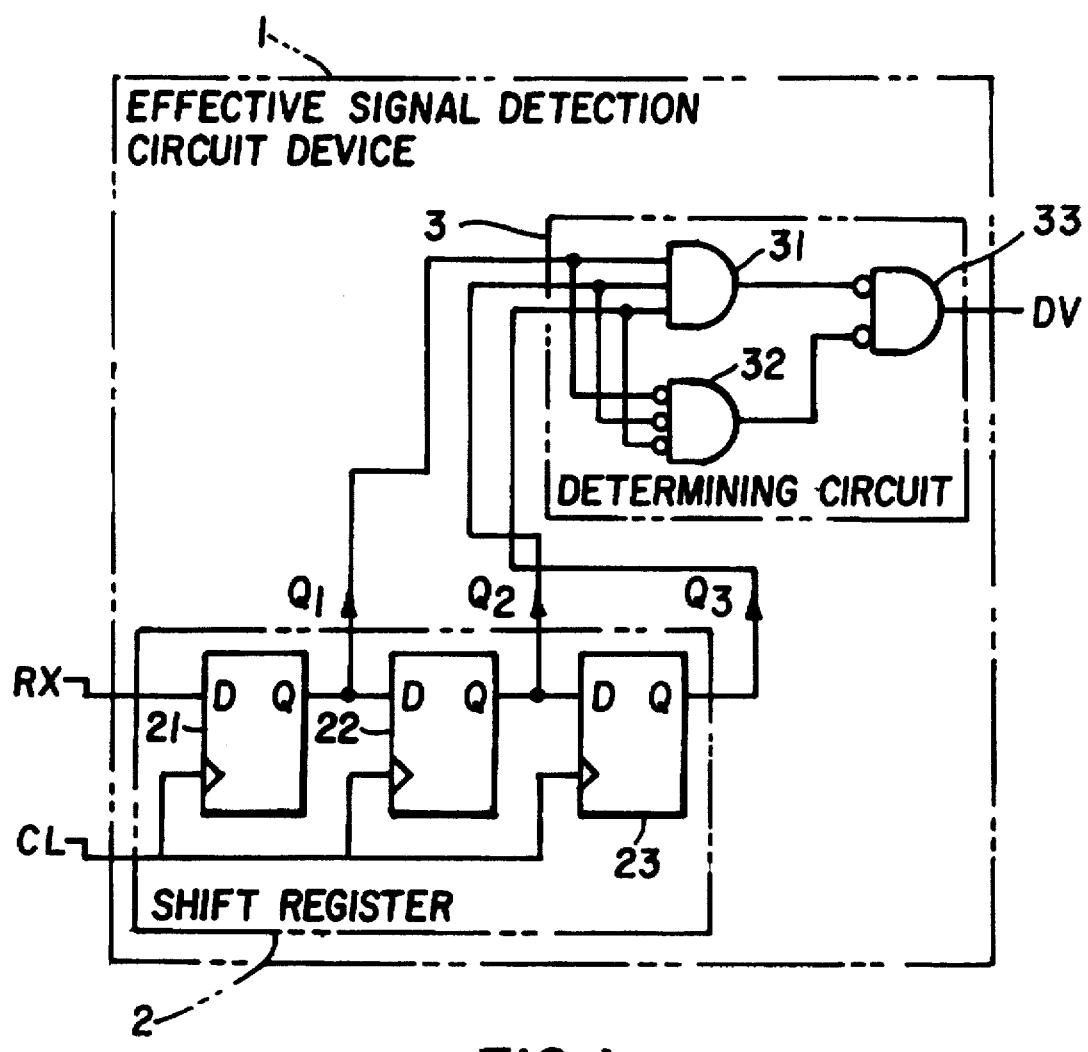
FIG. 1 is a circuit diagram showing a main portion of an embodiment of an effective signal detection circuit device according to the invention.
Figure 2:
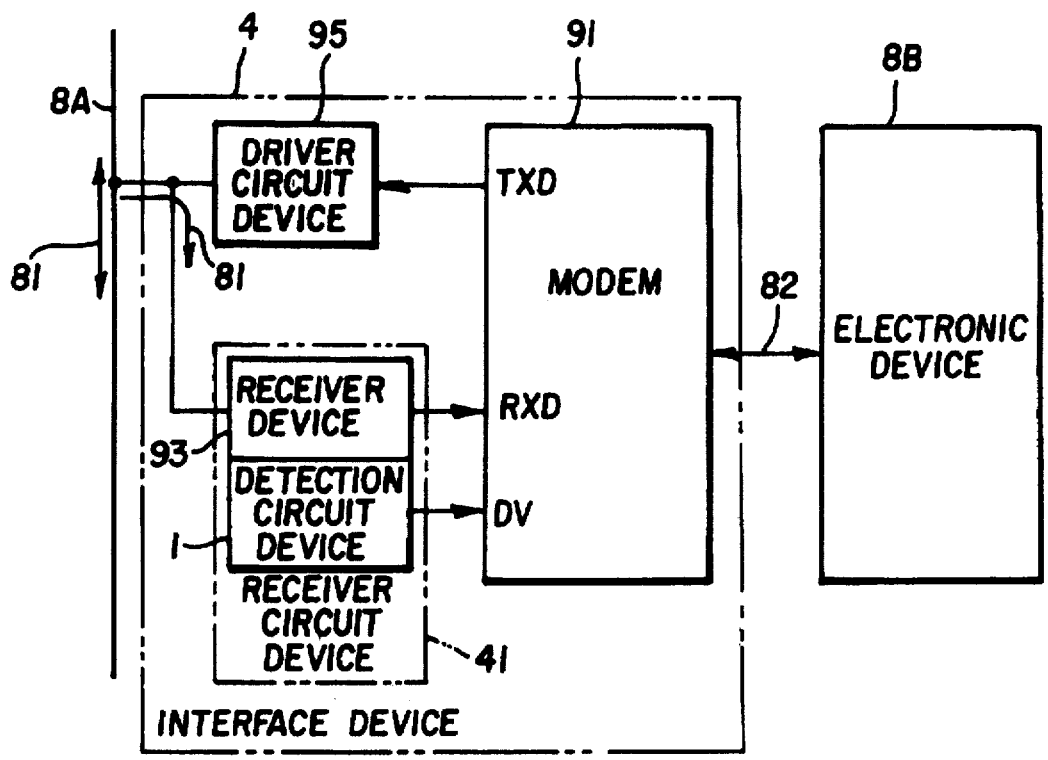
FIG. 2 is a circuit diagram showing an interface device provided with the effective signal detection circuit device of FIG. 1 together with a related transmission channel and electronic device.
Figure 3A:
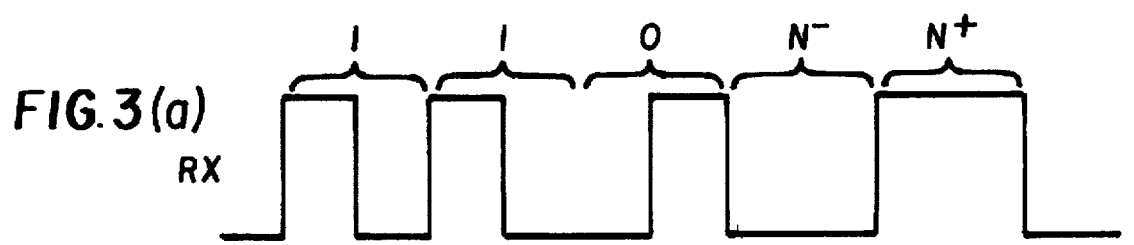
FIG. 3 is a timing chart for explaining the operation of the effective signal detection circuit device of FIG. 1.
Figure 3B:
Figure 3C:
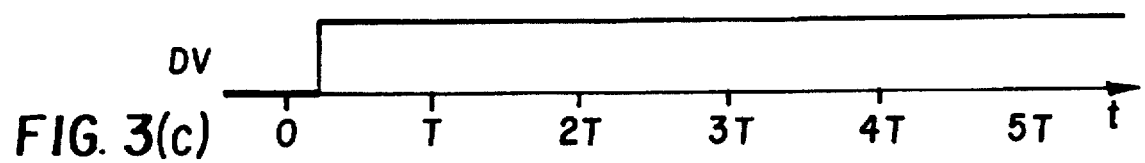

Hereinafter, the present invention will be explained with reference to the drawing figures which illustrate preferred embodiments of the invention. FIG. 1 is a circuit diagram showing a main portion of an embodiment of an effective signal detection circuit device according to the invention. FIG. 2 is a circuit diagram showing an interface device provided with the effective signal detection circuit device of FIG. 1 together with a related transmission channel and electronic device. FIG. 3 is a timing chart for explaining the operation of the effective signal detection circuit device of FIG. 1. In FIGS. 1 and 2, the same parts with those of FIGS. 11 and 12 are designated by the same reference numerals and their explanations are omitted for simplicity.

Figure 11:
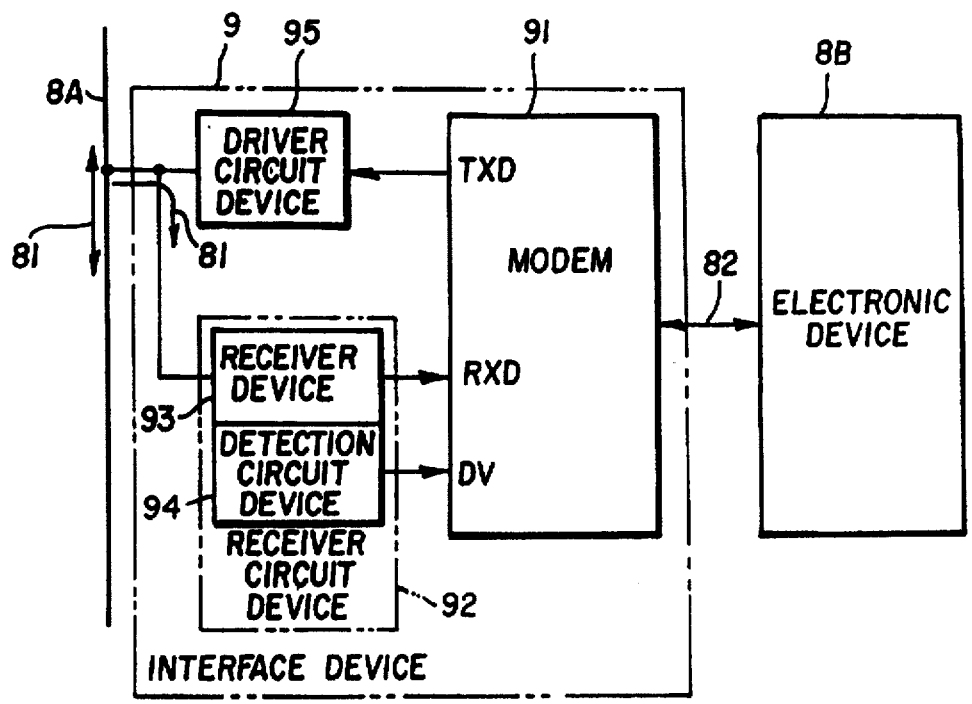
FIG. 11 is a block diagram showing the interface device that uses an effective signal detection circuit device will be shown in FIG. 12 together with the transmission channel and the electronic device.

Referring now to FIGS. 1 and 2, an interface device 4 adopts a receiver circuit device 41 in place of the receiver circuit device 91 of the interface device 9 of FIGS. 11 and 12. The receiver circuit device 41 adopts an effective signal detection circuit device 1 in place of the effective signal detection circuit device 94 shown in FIGS. 11 and 12.

The effective signal detection circuit device 1 has a shift register 2 and a determining circuit 3. The shift register 2 has three conventional D flip flop elements 21, 22 and 23 (hereinafter referred to as "D-FF") connected in the known serial input/parallel output type circuit configuration. A clock pulse signal (hereinafter referred to as "CL"), having a frequency twice as high as the bit frequency (1/T) of the bi-phase codes is input to the clock pulse terminal of the D-FFs 21, 22 and 23. Therefore, the clock pulse frequency is 2/T and the clock pulse period is T/2. Usually, the modem 91 uses a CL having a frequency eight time or sixteen times as high as the bit frequency of the bi-phase codes. By dividing this CL, the above described CL having a period of T/2 is easily obtained.

The first stage D-FF 21 receives the transmitted signal 81 as an RX signal at its D input terminal, and outputs an output signal $Q_1$ from its Q terminal at the period of the CL. The D-FF 21 inputs the output signal $Q_1$ to the D input terminal of the D-FF 22 located at the next stage. The output signal $Q_1$ is one of the parallel output signals of the shift register 2. The D-FFs 22 and 23 operate in the same way as the D-FF 21. Thus, the shift register 2 parallelizes the input signal RX by the CL of T/2 in its period to obtain a parallel signal bundle $Q_1$, $Q_2$, $Q_3$. The parallel signals $Q_1$, $Q_2$, $Q_3$ correspond to three consecutive half bits of the input signal RX of the bi-phase codes.

The determining circuit 3 comprises an AND element 31 having three input terminals, a NOR element 32 having three input terminals, and a NOR element 33 having two input terminals. The respective input terminals of the AND element 31 are connected with the respective input terminals of the NOR element 32 in parallel. And, the respective parallel signals $Q_1$, $Q_2$, $Q_3$ described above are input to the respective parallel connection points. The outputs of the AND element 31 and the NOR element 32 are input to the input terminals of the NOR element 33. The effective signal detection circuit device 1 outputs a DV signal from the output terminal of the NOR element 33.

The operation of the first embodiment shown in FIGS. 1 and 2 will now be explained with reference to FIG. 3. FIG. 3 shows that the level of the input signal RX is 0 (that is "L") in an initial operation stage (the state before t=0) of the detection circuit device 1 during which any signal to be transmitted does not exist. The input signal RX that is continuously "L" is input as it is to the detection circuit device 1, and then to the shift register 2. The levels of parallel signals $Q_1$, $Q_2$, $Q_3$ output from the shift register 2 are all "L". Naturally, the output of the AND element 31 to which the parallel signals $Q_1$, $Q_2$, $Q_3$ are input is "L", and the output of the NOR element 32 to which the parallel signals $Q_1$, $Q_2$, $Q_3$ are inverted and input is "H".

In the example shown in FIG. 3, any effective input signal RX does not exist, since the levels of the consecutive half bits are same. When the input signal RX indicates non-existence of an effective input signal by consecutive "L", the non-existing of an effective input signal is detected by NOR element 32. If the input signal RX is continuing its "H", non-existing of an effective input signal is detected by the AND element 31. That is, determination of ineffectiveness of the input signal RX is facilitated by connecting the AND element 31 and the NOR element 32 in parallel in correspondence to all the possible level relations of the consecutive three half bits when no effective bi-phase codes are existing. Then, either one of the outputs from the AND element 31 and the NOR element 32 becomes "L" corresponding to the level of the three consecutive half bits. The NOR element 33, to which are input "L" and "H" from AND element 31 and the NOR element 32, outputs an "L" DV signal indicative of non-existence of an effective transmitted signal 81.

When an input signal RX having a bi-phase code train of "1", "1", "0", "N−", "N+" is input to the detection circuit device 1 at the time t=0 as shown in (a) of FIG. 3, the input signal RX is input also to the shift register 2. The shift register 2 outputs, according to the CL having a period of T/2 shown in (b) of FIG. 3, a bundle of parallel signals $Q_1$, $Q_2$, $Q_3$ corresponding to respective half bits of the input signal RX to the determining circuit 3. The input signal RX input after the time t=0 is effective, since a same signal level does not continue longer than the bit period T. According to the rules of the bi-phase code train described before, the levels of all the parallel signals $Q_1$, $Q_2$, $Q_3$ corresponding to the input signal RX are never the same. The AND element 31 and the NOR element 32, to which such the parallel signals $Q_1$, $Q_2$, $Q_3$ are input, output "L" signals as a result of judgement that an effective transmitted signal 81 is existing, and the NOR element 33, to which the "L" signals are input, outputs an "H" DV signal indicating existence of the effective transmitted signal 81. In FIG. 3, the shift register 2 outputs, at the rising front of the first CL input after the time T=0, parallel signals $Q_1$, $Q_2$, $Q_3$ including "H" corresponding to the half bit "+" of the bi-phase code indicating "1" of the input signal RX. Though the levels of the parallel signals $Q_1$, $Q_2$, $Q_3$ were same in the initial state, the levels of the parallel signals $Q_1$, $Q_2$, $Q_3$ are not same any more at this point. So, the DV signal is switched from "L" to "H" (cf (c) of FIG. 3).

All the possible level combinations of the parallel signals $Q_1$, $Q_2$, $Q_3$ as the criterion for determining whether an effective transmitted signal is existing or not and corresponding levels of the DV signal are listed in Table 1.

TABLE 1

| $Q_1$ | $Q_2$ | $Q_3$ | DV |
|---|---|---|---|
| "H" | "H" | "L" | |
| "H" | "L" | "H" | |
| "L" | "H" | "H" | "H" |
| "L" | "L" | "H" | |
| "L" | "H" | "L" | |
| "H" | "L" | "L" | |
| "H" | "H" | "H" | "L" |
| "L" | "L" | "L" | |

A time constant circuit is not used in the circuit, that determines whether the effective transmitted signal 81 is existing or not, of the effective signal detection circuit device 1. Due to this, an IC into which the circuit configuration shown in FIG. 1 is incorporated facilitates solving the problems of the prior art shown in FIG. 12 caused by the circuit constant of the circuit elements or by their temperature coefficient deviations. As a result, it is facilitated to manufacture with high yield effective signal detection circuit devices which execute the predetermined operation.

Since a time constant circuit is not used, it is needless to incorporate resistors and capacitors which need wide layout area into an IC. Moreover, the effective signal detection circuit device 1 is consisted of three D-FFs, an AND element having three input terminals, a NOR element having three input terminals, and a NOR element having two input terminals. That is, the effective signal detection circuit device 1 of the invention can be consisted of standard logic elements. As a result, the layout area of the IC is confined in a narrow area of about 4,000 $\mu m^2$. By avoiding using any time constant circuit having resistors and capacitors, the consumed current is reduced to an order of several $\mu A$ when the detection circuit device 1 is operated at $V_{DD}$ of 3 V, bit frequency (1/T) of 31.25 kHz, and CL frequency of 62.5 kHz (2/T: twice as high as the bit frequency).

The shift register 2 is not always limited to the one that includes three D-FFs, and determining circuit 3 is not always limited to the one that includes the AND element 31 and MOR element 32 having three input terminals. For example, the shift register may be provided with four or more D-FFs. Further, the AND element and NOR element may be logic elements having four or more input terminals.

The shift register 2 is not always limited to the one that includes three D-FFs 21, 22 and 23, and determining circuit 3 is not always limited to the one that includes the AND element 31 having three input terminals, NOR element 32 having three input terminals. For example, any shift register may be used that has a circuit configuration suitable for converting the bi-phase codes at every half bit thereof to parallel signals. Further, any determining circuit may be used that has a circuit configuration suitable for determining that an effective transmitted signal is not existing when three consecutive half bit levels are identical.

Moreover, the determining circuit 3 is not always limited to the one that determines that an effective transmitted signal is not existing when three consecutive half bit levels are identical. For example, any determining circuit may be used that determines that an effective transmitted signal is existing when one of the levels of three consecutive half bits is not identical to the others. An example of this sort of determining circuit will be explained later.

Figure 4:
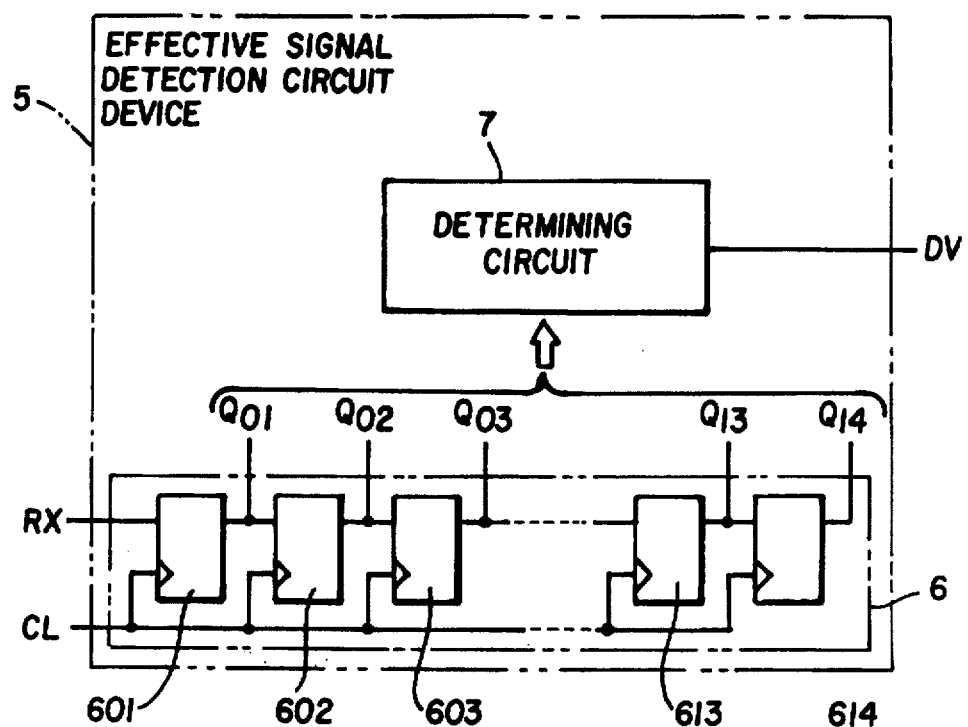
FIG. 4 is a circuit diagram showing a main portion of a second embodiment of an effective signal detection circuit device according to the invention.
Figure 5:
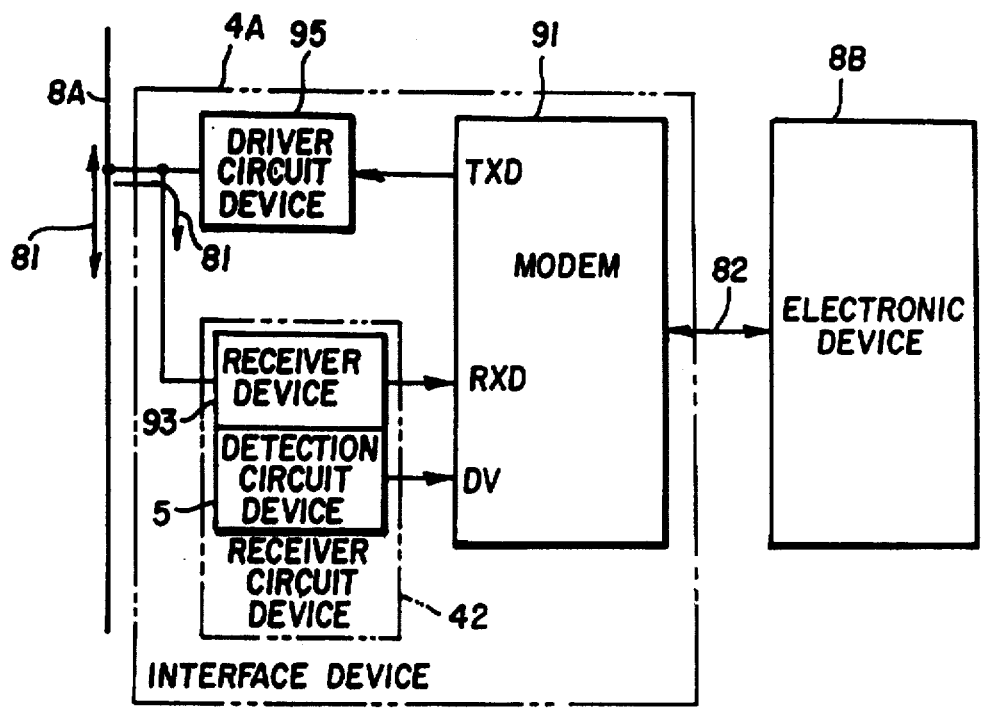
FIG. 5 is a circuit diagram showing an interface device provided with the effective signal detection circuit device of FIG. 4 together with a related transmission channel and electronic device.
Figure 6:
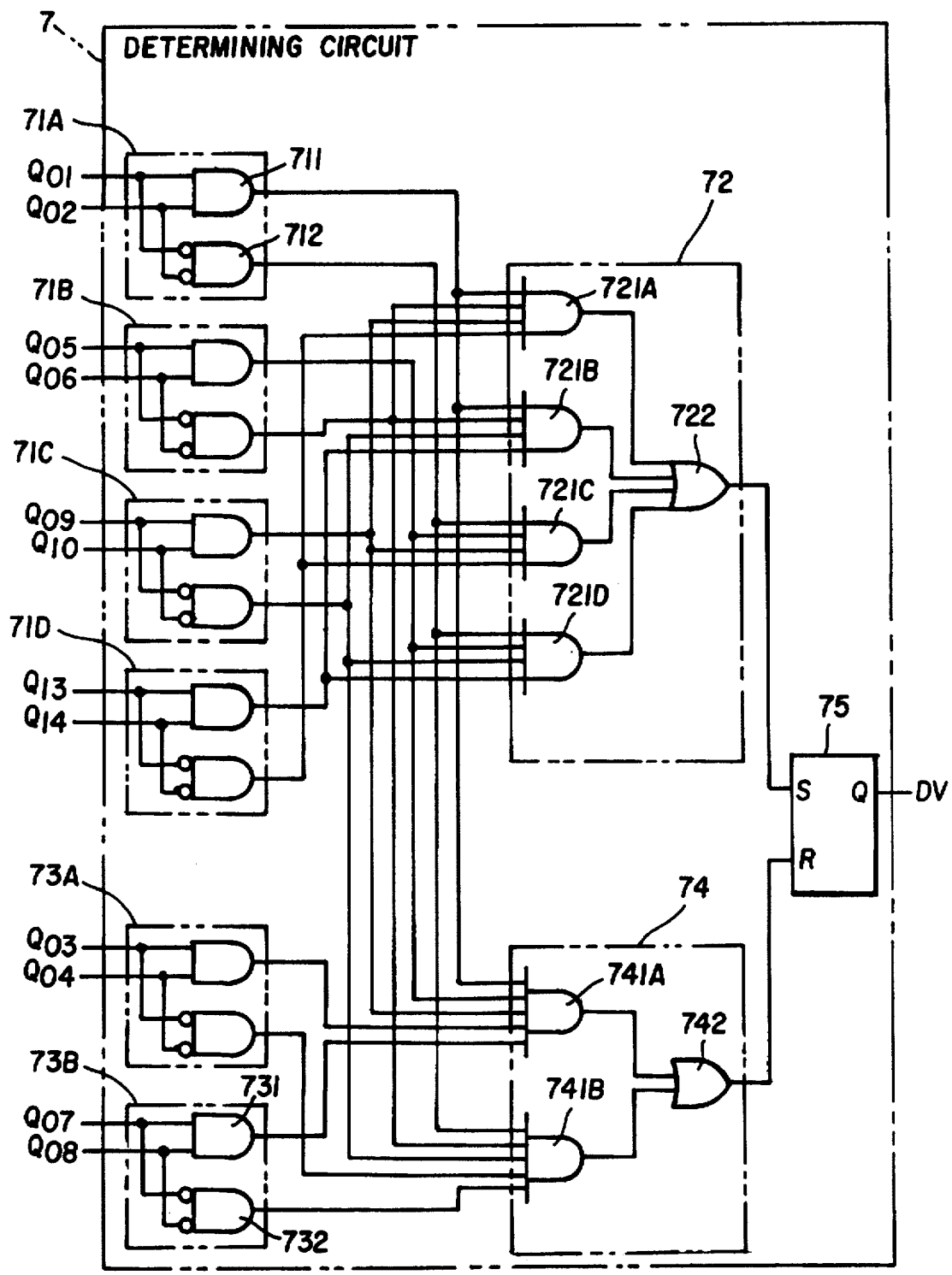
FIG. 6 is a circuit diagram showing a main part of the determining circuit shown in FIG. 4.
Figures 8A, 8B, 8C, 8D:
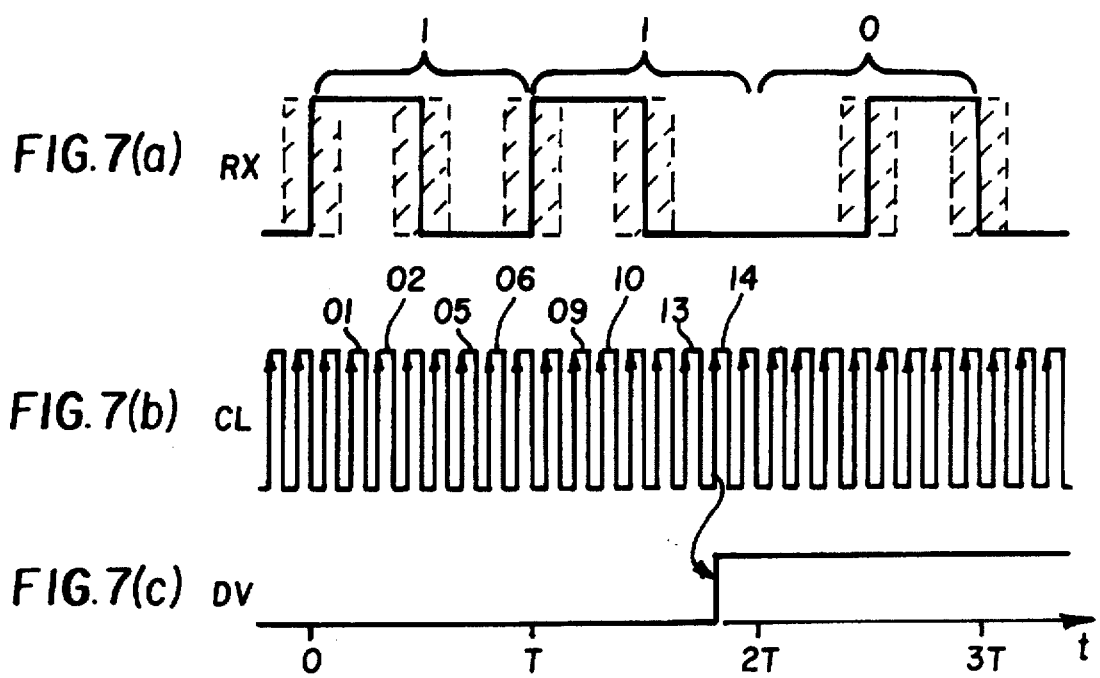
FIG. 8 is a set of wave charts for explaining the patterns for detecting the levels of three consecutive half bits of the bi-phase codes in the effective signal detection circuit device of FIG. 4.
Figures 9A, 9B, 9C, 9D:
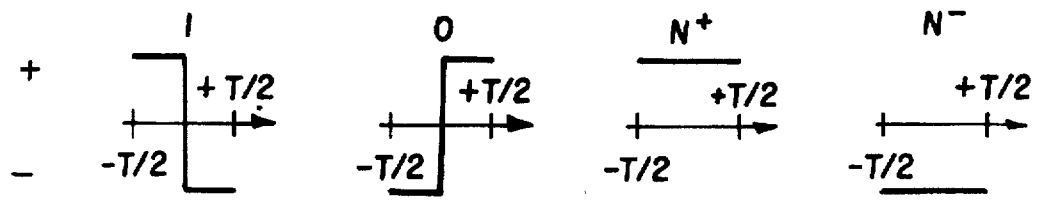
FIG. 9 is a wave chart showing a general example of the bi-phase coding.
Figure 10:
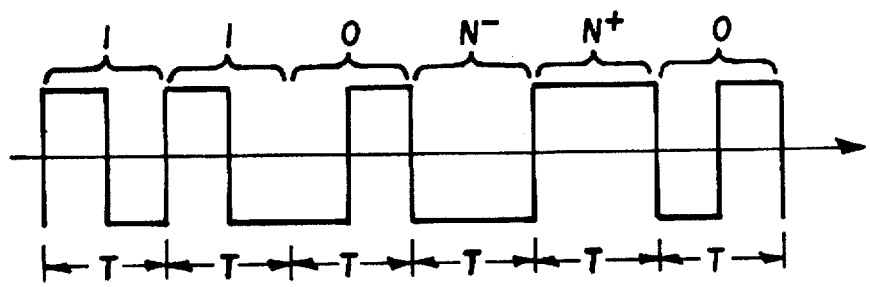
FIG. 10 is a wave chart showing a general example of a bi-phase code train.

A second embodiment of the invention will be described with reference to FIGS. 4–8. FIG. 4 is a circuit diagram showing a main portion of a second embodiment of an effective signal detection circuit device according to the invention. FIG. 5 is a circuit diagram showing an interface device provided with the effective signal detection circuit device of FIG. 4 together with a related transmission channel and electronic device. FIG. 6 is a circuit diagram showing a main part of the determining circuit shown in FIG. 4. FIG. 7 is a timing chart for explaining the operation of the effective signal detection circuit device of FIG. 4. FIG. 8 is a set of wave charts for explaining the patterns for detecting the levels of three consecutive half bits of the bi-phase codes in the effective signal detection circuit device of FIG. 4. In FIGS. 4, 5 and 6, the same parts with those of FIGS. 1, 2, 11 and 12 are designated by the same reference numerals and their explanations are omitted.

Referring now to FIGS. 4, 5 and 6, an interface device 4A adopts a receiver circuit device 42 in place of the receiver circuit device 41 of the interface device 4 of FIGS. 1 and 2. The receiver circuit device 42 adopts an effective signal detection circuit device 5 in place of the effective signal detection circuit device 1 shown in FIGS. 1 and 2. The effective signal detection circuit device 5 is provided with a shift register 6 and a determining circuit 7.

The shift register 6 is different in its circuit configuration from the shift register 2 in that the shift register 6 uses fifteen known D-FFs. The shift register 6 is also different from the shift register 2 in that a clock pulse signal CL having a frequency eight times as high as the bit frequency (1/T) of the bi-phase codes is input to the clock pulse terminals of these D-FFs 601 through 614. Therefore, the clock pulse frequency is 8/T and the clock pulse period is T/8. The CL having a period of T/8 is obtained from the CL of a modem 91 similarly as in the first embodiment. The shift register 6 parallelizes, as the shift register 2 does, the input signal RX by the CL of T/8 in its period to obtain a parallel signal bundle $Q_{01}$ to $Q_{14}$. The parallel signals $Q_{01}$ to $Q_{14}$ correspond to four consecutive half bits of the input signal RX of the bi-phase codes.

The detecting circuit 7 is provided with a first determining part, a second determining part, and a known RS flip flop 75 as a flip flop circuit having a set terminal to which is input a set signal and a reset terminal to which is input a reset signal. The first determining part of the determining circuit 7 is provided with four level detectors 71 (from 71A to 71D), and an effective signal detector 72. Each level detector 71 consists of an AND element 711 having two input terminals and a NOR element 712 having two input terminals. The respective input terminals of the AND element 711 are connected in parallel with the respective input terminals of the NOR element 712. Among the parallel signals from $Q_{01}$ to $Q_{14}$ output from the shift register 6, a pair of parallel signals from a pair of neighboring D-FFs is input to the parallel connection points of the AND element 711 and the NOR element 712 as shown in FIG. 6.

The effective signal detector 72 is provided with four AND elements 721 (from 721A to 721D) having four input terminals, and an OR element 722 having four input terminals. Respective output signals output from the respective AND elements 711 and the NOR elements 712 of the level detectors 71A to 71D are input to the respective input terminals of the AND elements 721A to 721D as shown in FIG. 6. Respective output signals output from the AND elements 721A to 721D are input to respective input terminals of the OR element 722.

The second determining part of the detecting circuit 7 is provided with the above described level detectors 71 (from 71A to 71D), and a non-effective signal detector 74. The second determining part may be provided with two more level detectors 73 (73A, 73B) if necessary. Each of the level detectors 73 consists of an AND element 731 having two input terminals and a NOR element 732 having two input terminals in the same way as the detector 71. The respective input terminals of the AND element 731 is connected in parallel with the respective input terminals of the NOR element 732. Among the parallel signals from $Q_{01}$ to $Q_{14}$ output from the shift register 6, a pair of parallel signals from a pair of neighboring D-FFs is input to the parallel connection points of the AND element 731 and the NOR element 732 as shown in FIG. 6.

The non-effective signal detector 74 consists of two AND elements 741 (741A, 741B) having five input terminals and an OR element 742 having two input terminals. As shown in FIG. 6, the output signals output from the AND elements 711 of the level detectors 71A, 71B, and 71C are input to the AND element 741A. The output signals output from the NOR elements 712 of the level detectors 71A, 71B, and 71C are input to the AND element 741B. The output signals output from the AND elements 731 of the level detectors 73 are input to the AND element 741A. The output signals output from the NOR elements 732 of the level detectors 73 are input to the AND element 741B. Respective output signals output from the AND elements 741A and 741B are input to respective input terminals of the OR element 742.

An RS flip flop (hereinafter referred to as "RS-FF") has a set terminal S to which is input an output signal of the OR element 722, and a reset terminal R to which is input an output signal of the OR element 742. The RS-FF outputs from its Q terminal a DV signal indicative of existence or non-existence of an effective transmitted signal.

The effective signal detection circuit device 5 affords same functions and effects as those of the effective signal detection circuit device 1. In addition, the detection circuit device 5 facilitates solving following problems anticipated to be caused in the detection circuit device 1.

In the effective signal detection circuit device 1, the CL fed to the shift register 2 rises and falls independently of the changeover timing of the half bits included in the bi-phase codes of the transmitted signal 81. Because of this, time difference between the rise and fall timing of the CL and the changeover timing of the half bits is not constant. Further, the time difference is unpredictable.

Ideally, the changeover period of the half bit is T/2 or T. In practice, however, the changeover period sometimes deviates from T/2 or T. Moreover, it should be kept in mind that the practical bit period T of the bi-phase codes used in the station transmitting the signal 81 is different by several % from the fundamental period (T) of the CL practically used in the station receiving the signal 81. (The period of the CL should exactly be a fraction of an even number of the bit period T.) Further more, an unwanted "H" signal may be caused on the transmission channel 8A, e.g. by spike noise, even when any transmitted signal 81 is not existing on the transmission channel 8A.

The effective signal detection circuit device 1 may malfunction under the above described abnormal states. The effective signal detection circuit device 5 of the second embodiment is configured so as to avoid malfunction.

The operation of the second embodiment shown in FIGS. 4, 5 and 6 will now be explained with reference to FIG. 7. FIG. 7 shows that the level of the input signal RX is 0 (that is "L") in an initial operation stage (the state before =0) of the detection circuit device 5 during which any signal to be transmitted is not existing. The input signal RX that is continuously "L" is input as it is to the detection circuit device 5, and then to the shift register 6. The levels of parallel signals $Q_{01}$ through $Q_{14}$ output from the shift register 6 are all "L". The output signals from the AND elements 711, 731 to which the parallel signals $Q_{01}$ through $Q_{14}$ are input are "L", and the output signals from the NOR elements 712, 732 are "H".

The output signals from the AND elements 721A through 721D to which these "L" and "H" are simultaneously input are all "L". The output signal from the OR element 722, to all the input terminals thereof these "L" are input, is "L". The output signal from the AND element 741A, to all the input terminals thereof "L" are input, is "L". The output signal from the AND element 741B, to all the input terminals thereof "H" are input, is "H". The output signal from the OR element 742, to which "L" from the AND element 741A and "H" from the AND element 741B are input, is "H". The output signal from the OR element 742 is the output signal from the second determining part. As has been explained so far, the operation of the second determining part is equivalent to the operation of the determining circuit 3 of the second embodiment.

When the input signal RX is continuing its "H", the AND elements 711, 731 output "H", and the NOR elements 712, 732 output "L". Therefore, the AND element 741A outputs "H", and the AND element 741B outputs "L". The OR element 742, to which "H" from the AND element 741A and "L" from the AND element 741B are input, outputs "H" as the output signal of the second determining part. The RS-FF 75, to the reset terminal R thereof "H" is input from the OR element 742, outputs an "L" DV signal indicative of non-existence of an effective transmitted signal 81.

Now, we consider an input signal RX having a bi-phase code train of "1", "1", "0" and is input to the detection circuit device 5 at the time t=0 as shown in (a) of FIG. 7. In (a) of FIG. 7, the half bit changeover timing of the bi-phase codes is indicated by hatching with broken lines for schematically illustrating ranges within which the practical changeover timing may distribute. The input signal RX is input also to the shift register 6. The shift register 6 outputs, according to the CL having a period of T/8 shown in (b) of FIG. 7, a bundle of parallel signals $Q_{01}$ through $Q_{14}$ corresponding to respective half bits of the input signal RX.

The input signal RX after the time t=0 exemplary shown in (a) of FIG. 7 is effective, since a same signal level does not continue longer than the bit period T. According to the rules of the bi-phase code train described before, the levels of all the parallel signals $Q_{01}$ through $Q_{14}$ corresponding to the input signal RX are never be the same. The level detectors 71 (from 71A to 71D) are detectors which determine the levels of four consecutive half bits. The AND element 711 of the level detector 71 outputs "H" only when all the levels of the input signals are "H". On the other hand, the NOR element 712 of the level detector 71 outputs "L" only when all the levels of the input signals are "L".

Among the AND elements 721 (from 721A to 721D) to which signals are input from the AND elements 711 and the NOR elements 712, the AND elements 721A outputs "H" when four consecutive half bits of the bi-phase codes have a level relation shown in (a) of FIG. 8. The AND elements 721B outputs "H" when four consecutive half bits of the bi-phase codes have a level relation shown in (b) of FIG. 8. The AND elements 721C outputs "H" when four consecutive half bits of the bi-phase codes have a level relation shown in (c) of FIG. 8. And, the AND elements 721D outputs "H" when four consecutive half bits of the bi-phase codes have a level relation shown in (d) of FIG. 8.

Thus, four AND elements 721 (from 721A to 721D) cope with all the level relations of four consecutive half bits of the bi-phase codes. Therefore, "H" is always output from either one of the AND elements 721 (from 721A to 721D) when the bi-phase codes are effective. The OR element 722, to which signals are input from four AND elements 721, always outputs "H" as the output signal of the first determining part when the bi-phase codes are effective. The RS-FF 75, to the set terminal S thereof this "H" is input from the OR element 742, outputs an "H" DV signal indicative of existence of an effective transmitted signal 81.

Referring now to FIG. 7, at the point when the fourteenth CL (indicated by a numeral 14 in (b) of FIG. 7) except for the changeover timing of the bi-phase codes after an effective input signal RX was input rises, the parallel signals $Q_{01}$ through $Q_{14}$ having the level relation shown in (a) of FIG. 8 are output from the shift register 6 to change over the DV signal from "L" to "H" (cf (c) of FIG. 7).

In the determining circuit 7 of the second embodiment, the RS-PF 75 continues outputting the "H" DV signal according to its specific operation characteristics, once the DV signal has been switched to "H", until the RS-FF 75 will be reset by the input signal RX keeping its "H" or "L" level. And, by conducting level detection in the level detectors 71 by using parallel signal pairs of many parallel signals $Q_{01}$ through $Q_{14}$ based on the. CL having a period of T/8, level detection is avoided in the practical changeover timing of the half bits of the bi-phase codes. By these measures, malfunction is avoided even when the practical changeover timing of the half bits of the bi-phase codes deviates from the ideal changeover timing. By the circuit configuration that determines whether the input signal RX is effective or not by using parallel signal pairs of many parallel signals $Q_{01}$ through $Q_{14}$ based on the CL having a period of T/8, it is facilitated avoiding the part of the input signal RX on which noise is superimposed. Due to this, the determining circuit 7 never malfunctions even when the noise is superimposed on the input signal RX. The determining circuit 7 never malfunctions also when "H" is superimposed on one of the half bits of "L" by noise, since the RS-FF 75 is not reset as far as all the levels of three consecutive half bits are not identical. The RS-FF 75 is not set according to its specific operation characteristics as far as the level relations shown in FIG. 8 are not realized. Therefore, the determining circuit 7 never malfunctions, as far as the level relations shown in FIG. 8 are not realized, even when "H" is superimposed on the half bits of "L" by noise in the state the RS-FF 75 has been reset by an "L" input signal RX.

The level detectors 73 conducts level detection that supplements the level detection of the level detectors 71 to improves the detection reliability of the second determining part. The level detectors 73 are not always indispensable. When the level detectors 73 is not provide, the AND elements 741 may be provided with three input terminals.

All the possible level combinations of the parallel signals $Q_{01}$ through $Q_{14}$ as the criterion for determining in the effective signal detection circuit device 5 whether an effective transmitted signal is existing or not and corresponding levels of the DV signal are listed in Table 2.

TABLE 2

| | | | | | | Level of parallel signal | | | | | | | | |
|---|---|---|---|---|---|---|---|---|---|---|---|---|---|---|
| $Q_{01}$ | $Q_{02}$ | $Q_{03}$ | $Q_{04}$ | $Q_{05}$ | $Q_{06}$ | $Q_{07}$ | $Q_{08}$ | $Q_{09}$ | $Q_{10}$ | $Q_{11}$ | $Q_{12}$ | $Q_{13}$ | $Q_{14}$ | Set/Reset |
| H | H | X | X | L | L | X | X | H | H | X | X | L | L | Set |
| H | H | X | X | L | L | X | X | L | L | X | X | H | H | |
| L | L | X | X | H | H | X | X | H | H | X | X | L | L | |
| L | L | X | X | H | H | X | X | L | L | X | X | H | H | |
| L | L | L | L | L | L | L | L | L | L | X | X | X | X | Reset |
| H | H | H | H | H | H | H | H | H | H | X | X | X | X | |

Note 1: H indicates high level.
Note 2: L indicates low level.
Note 3: X indicates negligence in determination.

Similarly as in the first embodiment, the effective signal detection circuit device 5 does not need any time constant circuit in the circuit that determines whether the effective transmitted signal 81 is existing or not. Due to this, an IC into which the circuit configuration shown in FIG. 6 is incorporated facilitates solving the problems of the prior art shown in FIG. 12 caused by the circuit constant of the circuit elements or by their temperature coefficient deviations. As a result, it is facilitated to manufacture with high yield effective signal detection circuit devices, which execute the predetermined operation.

Since a time constant circuit is not used, it is needless to incorporate resistors and capacitors which need wide layout area into an IC. Moreover, the effective signal detection circuit device 5 is consisted of fourteen D-FFs, six AND elements having two input terminals, two NOR elements having two input terminals, four AND elements having four input terminals, two AND elements having five input terminals, an OR element having four input terminals, an OR element having two input terminals, and an RS-FF. That is, the effective signal detection circuit device 5 of the invention can be consisted of standard logic elements. As a result, the layout area of the IC is confined in a narrow area of about 20,000 µm². By avoiding using any time constant circuit having resistors and capacitors, the consumed current is reduced down to less than 10 µA when the detection circuit device 1 is operated at $V_{DD}$ of 3 V, bit frequency (1/T) of 31.25 kHz, and CL frequency of 62.5 kHz (2/T: twice as high as the bitfrequency).

The flip flop circuit of the effective signal detection circuit device 5 of the second embodiment is not limited to an RS-FF. Any type of flip flop circuits having a set terminal and a reset terminal, e,g, an RST flip flop may be used.

So far, the detection circuit device 5 has been explained by way of a shift register consisted of fourteen D-FFs, and a determining circuit consisted of six AND elements having two input terminals, six NOR elements having two input terminals, four AND elements having four input terminals, two AND elements having five input terminals, an OR element having four input terminals, an OR element having two input terminals, and an RS-FF. However, the shift register and the determining circuit are not limited to those having such configurations that described above. For example, any shift register may be used that has a circuit configuration suitable for converting the bi-phase codes at every half bit thereof to parallel signals. Further, any determining circuit may be used that has a circuit configuration suitable for determining that an effective transmitted signal does exist when either one of three consecutive half bit levels is different from the others and that an effective transmitted signal does not exist when three consecutive half bit levels are identical.

In the foregoing explanation, the frequency of the CL fed to the shift register is twice or eight times as high as the bit frequency (1/T) of the bi-phase codes. However, other CLs may be used as far as they have a frequency obtained by multiplying the bit frequency (1/T) by an even number.

The present invention has been explained by way of the effective signal detection circuit devices 1 and 7 which adopt standard logic elements. However, any effective signal detection circuit device which uses appropriate circuit elements may be used as far as the effective signal detection circuit is provided with a shift register that converts the bi-phase codes at every half bit thereof to parallel signals with a CL having a frequency obtained by multiplying the bit frequency (1/T) by an even number, and with a circuit that determines whether an effective received signal is existing or not base on the parallel signals corresponding at least to three consecutive half bits.

The effective signal detection circuit devices of the invention constructed as described above show following effects.

(1) Since the effective signal detection circuit devices do not need any circuit having a long time constant that is configured by registers, capacitors, etc., existence and non-existence of effective bi-phase codes can be detected with excellent accuracy without being affected by the deviations of the resistance and capacitance values. As a result, it is facilitated to manufacture with high yield effective signal detection circuit devices which execute the predetermined operation.

(2) Since the effective signal detection circuit devices can be configured without using any circuit having a long time constant and configured by registers, capacitors, etc., the layout area of the IC can be confined in a narrow area of about from 4,000 µm² to 20,000 µm² corresponding to from one twenty fifth to one-fifth of the conventional layout area.

(3) By avoiding using any time constant circuit having registers and capacitors, the consumed current is reduced to from one-several tenth to one-several hundredth of the charge-up current, chiefly determined by the charge-up current of the capacitors, of the conventional effective signal detection circuit devices.

(4) As a result, the receiver circuit device can be integrated into an IC, and further more the entire interface device including its modem can easily be integrated into a single chip.

(5) By adopting such a circuit configuration that is adopted in the second embodiment, malfunction may be avoided even in such an abnormal operation state that noise is applied to the transmission channel.

What is claimed is:

1. An effective signal detection circuit device included in a receiver circuit device of a serial transmission apparatus that transmits data using bi-phase codes consisted of two half bits, the effective signal detection circuit device comprising:

a shift register for converting every half bit of the bi-phase codes to a parallel signal by using a clock signal having a frequency obtained by multiplying a bit frequency of the bi-phase codes by an even number; and a determining circuit for receiving parallel signals corresponding to at least three consecutive half bits that are output from the shift register and determining existence or non-existence of an effective transmitted signal;

wherein the determining circuit comprises a detector circuit for detecting that the parallel signals have a same signal level, thereby indicating non-existence of an effective transmitted signal; and wherein the detector circuit further detects that one of the parallel signals has a signal level different from the signal level of the other parallel signals, thereby indicating existence of an effective transmitted signal.

2. The effective signal detection circuit device as claimed in claim 1, wherein the shift register comprises logic circuit elements, and the determining circuit comprises logic circuit elements.

3. The effective signal detection circuit device as claimed in claim 1, wherein the detector circuit comprises means for obtaining logical AND and logical NOR results of a signal level corresponding to at least three consecutive half bits, and further obtaining a logical NOR of the results to thereby determine existence or non-existence of an effective transmitted signal.

4. An effective signal detection circuit device included in a receiver circuit device of a serial transmission apparatus that transmits data using bi-phase codes consisted of two half bits, the effective signal detection circuit device comprising:

a shift register for converting every half bit of the bi-phase codes to a parallel signal by using a clock signal having a frequency obtained by multiplying a bit frequency of the bi-phase codes by an even number; and a determining circuit for receiving parallel signals corresponding to at least three consecutive half bits that are output from the shift register and determining existence or non-existence of an effective transmitted signal;

wherein the determining circuit comprises:

a first determining part for detecting one of the parallel signals corresponding to at least three consecutive half bits, the one of the parallel signals having a signal level different from the signal level of the other parallel signals, to thereby determine existence of an effective transmitted signal;

a second determining part for detecting the parallel signals corresponding to at least three consecutive half bits, the parallel signals having a same signal level, to thereby determine non-existence of an effective transmitted signal; and a flip flop circuit having a reset terminal and a set terminal, the flip flop circuit being set by the output signal of the first determining part input to the set terminal thereof, the flip flop circuit being reset by the output signal of the second determining part input to the reset terminal thereof, and the flip flop circuit outputting an output signal as an output signal of the determining circuit.

* * * * *